(12) United States Patent
Chen

(10) Patent No.: US 8,391,092 B2
(45) Date of Patent: Mar. 5, 2013

(54) CIRCUIT AND METHOD FOR ELIMINATING BIT LINE LEAKAGE CURRENT IN RANDOM ACCESS MEMORY DEVICES

(75) Inventor: Chung Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 271 days.

(21) Appl. No.: 12/801,929

(22) Filed: Jul. 2, 2010

(65) Prior Publication Data

US 2012/0002496 A1    Jan. 5, 2012

(51) Int. Cl.
*G11C 7/00* (2006.01)
(52) U.S. Cl. .................................... 365/203; 365/222
(58) Field of Classification Search .................. None
See application file for complete search history.

(56) References Cited

U.S. PATENT DOCUMENTS

| 6,707,739 B2 | 3/2004 | Chen | |
|---|---|---|---|
| 6,775,194 B2 | 8/2004 | Chen | |
| 2006/0285405 A1* | 12/2006 | Kawabata et al. | 365/203 |
| 2008/0298152 A1* | 12/2008 | Ito et al. | 365/222 |

* cited by examiner

*Primary Examiner* — Hoai V Ho
*Assistant Examiner* — James G Norman
(74) *Attorney, Agent, or Firm* — Stites & Harbison, PLLC; Juan Carlos A. Marquez, Esq.

(57) ABSTRACT

A method for eliminating bit line leakage current of a memory cell in random access memory devices comprises the steps of: periodically activating a pre-charge equalization circuit, which provides a pre-charge voltage to a pair of complementary bit lines of a memory cell, if the memory cell is in a self-refresh mode or a standby mode; and temporarily activating the pre-charge equalization circuit after the memory cell is refreshed if the memory cell is in the self-refresh mode or the standby mode.

16 Claims, 9 Drawing Sheets

CIRCUIT AND METHOD FOR ELIMINATING BIT LINE LEAKAGE CURRENT IN RANDOM ACCESS MEMORY DEVICES

BACKGROUND OF THE INVENTION

1. Field of the Invention

The present invention relates to a circuit and a method for eliminating bit line leakage current in random access memory devices.

2. Description of the Related Art

Currently, semiconductor memory devices, such as dynamic random access memory (DRAM) devices, are widely used as solid storage media in low-cost digital devices, such as personal computers, cellular phones and personal digital assistants. Generally, a DRAM memory cell, which can store one bit of data, is composed of a transistor and a capacitor. FIG. 1 shows a DRAM memory cell 100 with a transistor 102 and a capacitor 104, wherein one end of the transistor 102 is connected to the capacitor 104, and the other end of the transistor 102 is connected to a bit line BL. The control end of the transistor 102 is connected to a word line WL. The bit of data is stored in the capacitor as electrical charges. Unfortunately, after a certain amount of time, the charges stored in the capacitor 104 are discharged through the substrate or other paths such that the stored data is lost. Accordingly, a periodic refresh operation is required to rewrite the stored data back to the memory cell 100.

To read the data stored in the memory cell 100, a sense amplification technique is applied. Typically, the bit line BL connected to the transistor 102 is connected to a sense amplifier along with another bit line BL'. The sense amplifier determines the data stored in the memory cell 100 by sensing the voltage difference of the voltages on the bit line BL and the bit line BL'. Accordingly, both the bit line BL and the bit line BL' are pre-charged to a high voltage for the sense amplification technique to be successfully applied. FIG. 2 shows a typical bit line pre-charge circuit applied in a DRAM device. As shown in FIG. 2, the bit line pre-charge circuit 200 comprises a first transistor 202 and a second transistor 204. The first transistor 202 connects a pre-charge voltage VEQ to the bit line BL. The second transistor 204 connects the pre-charge voltage VEQ to the bit line BL'. Both the first transistor 202 and the second transistor 204 are controlled by a pre-charge signal EQD. If the threshold voltages of the first transistor 202 and the second transistor 204 are not equal, the voltages on the bit line BL and the bit line BL' will not be equal. To overcome this defect, the bit line pre-charge circuit 200 can further comprise a third transistor 206 connecting the bit line BL and the bit line BL', wherein the third transistor 206 is also controlled by the pre-charge signal EQD.

To reduce power consumption, some DRAM devices can be operated in a self-refresh mode. While operating in a self-refresh mode, the DRAM device cannot be accessed, and a periodic self-refresh operation, performed internally and automatically, is required. FIG. 3 shows a timing diagram of the control signals of a typical DRAM device, wherein the DRAM device is in a self-refresh mode. As shown in FIG. 3, the refresh request is activated periodically, wherein the period is controlled by a timing counter. When a refresh is due, a refresh request is activated, and the refresh operation is performed within the refresh timing window tCBR. When refreshed, the pre-charge signal EQD of the corresponding cell is deactivated, while the pre-charge signal EQD of other cells are kept activated.

Another type of random access memory device, pseudo static random access memory (PSRAM), is a variant of other DRAM devices. A PSRAM device is a DRAM device with built-in refresh and address-control circuitry that allows it to function similarly to a SRAM device. Typically, a PSRAM can be operated in a stand-by mode or an active mode. While operating in an active mode, the PSRAM device can be accessed. However, while operating in a stand-by mode, the PSRAM device cannot be accessed. Both the active mode and the stand-by mode require a periodic refresh operation. FIG. 4 shows a timing diagram of the control signals of a typical PSRAM device. The refresh operation for a PSRAM device operating in a stand-by mode is similar to that of a DRAM device operating in a self-refresh mode. In the active mode, there is a signal ATD (address transition detection) for each access operation. Each ATD pulse interval includes three operations. First, a pre-charge operation for the previously activated address is performed. Second, a refresh operation is performed if a refresh request is activated. Third, a pre-charge operation for the current activated address is performed. As shown in FIG. 4, the pre-charge signal EQD of cells not being refreshed or accessed are kept activated.

However, there are some drawbacks to continuously activating the pre-charge signal EQD. Particularly, there may be bit line leakage currents existing. Referring to FIG. 1, there may be a leakage current between the bit line BL and the word line WL through the inter dielectric. There may be another leakage current between the bit line BL and the word line WL through the gate oxide of the transistor 102. Yet another leakage current could occur between the bit line BL and the P well of the transistor 102 through the contact of the bit line BL. Accordingly, the stand-by current is increased due to the contribution of the bit line leakage currents. A current limiter may be utilized to reduce the bit line leakage currents. However, the bit line leakage currents cannot be fully eliminated. Therefore, there is a need to design a circuit and a method for eliminating bit line leakage current in random access memory devices.

SUMMARY OF THE INVENTION

The circuit for eliminating bit line leakage current in random access memory devices according to one embodiment of the present invention comprises a pre-charge equalization circuit. The pre-charge equalization circuit provides a pre-charge voltage to a pair of complementary bit lines of a memory cell in accordance with a pre-charge signal. When the memory cell is in a self-refresh mode or a stand-by mode, the pre-charge signal is activated periodically and is also activated after the memory cell is refreshed.

The method for eliminating bit line leakage current of a memory cell in random access memory devices comprises the steps of: periodically activating a pre-charge equalization circuit, which provides a pre-charge voltage to a pair of complementary bit lines of a memory cell, if the memory cell is in a self-refresh mode or a standby mode; and temporarily activating the pre-charge equalization circuit after the memory cell is refreshed if the memory cell is in the self-refresh mode or the standby mode.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 1:
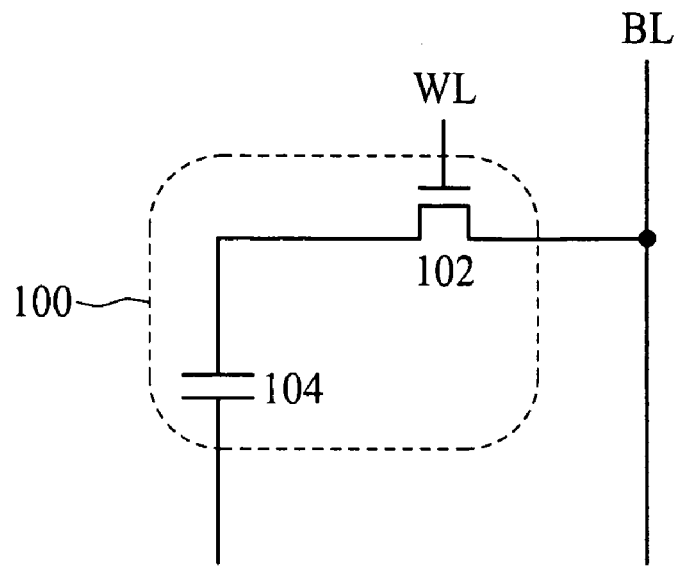
FIG. 1 shows a typical DRAM memory cell.
Figure 2:
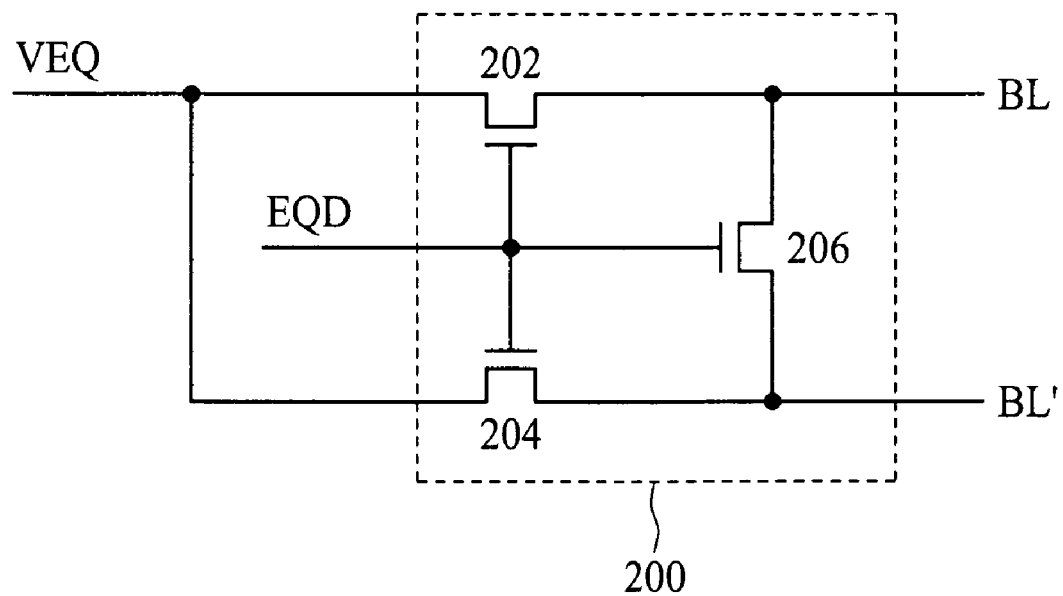
FIG. 2 shows a typical bit line pre-charge circuit applied in a DRAM device.
Figure 3:
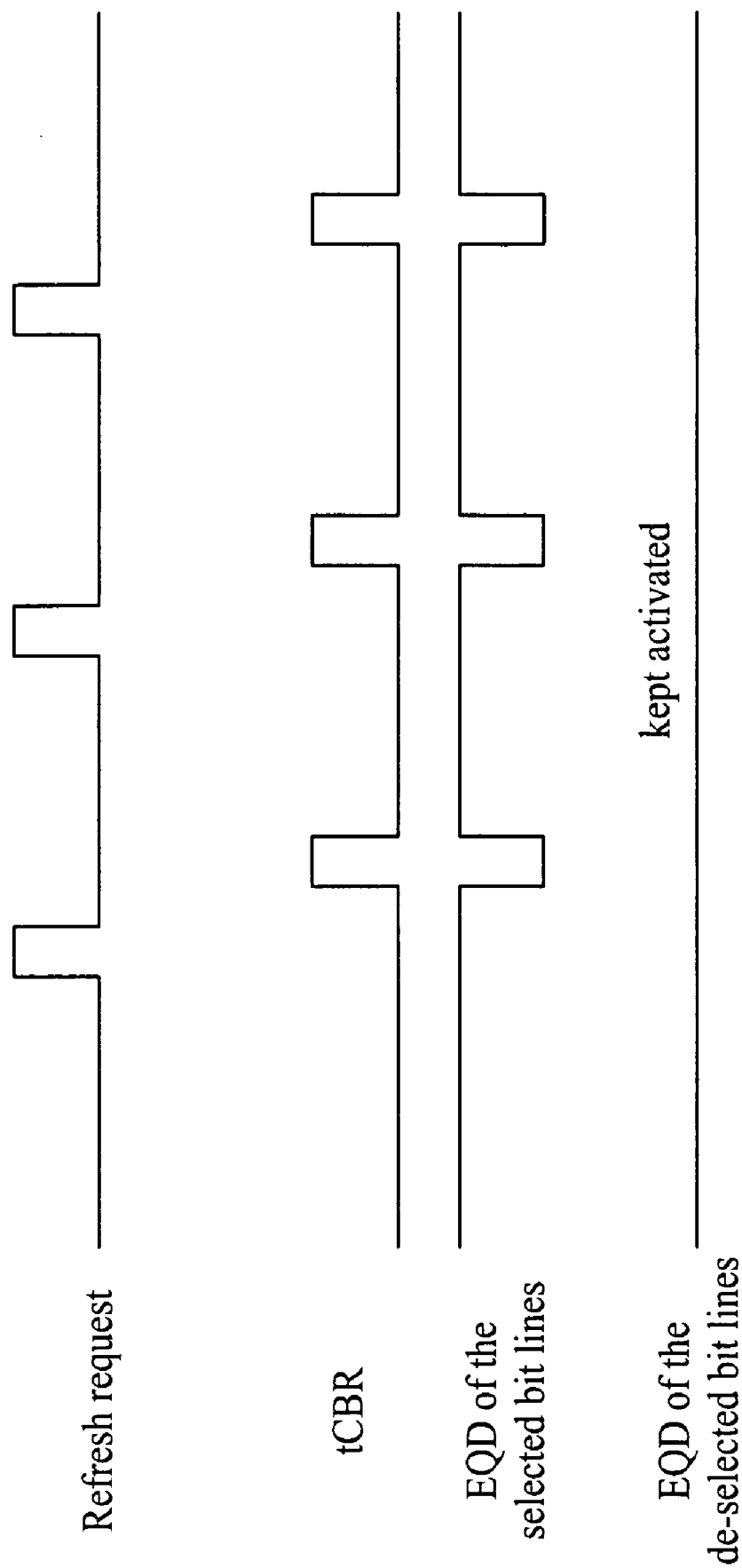
FIG. 3 shows a timing diagram of the control signals of a typical DRAM device.
Figure 4:
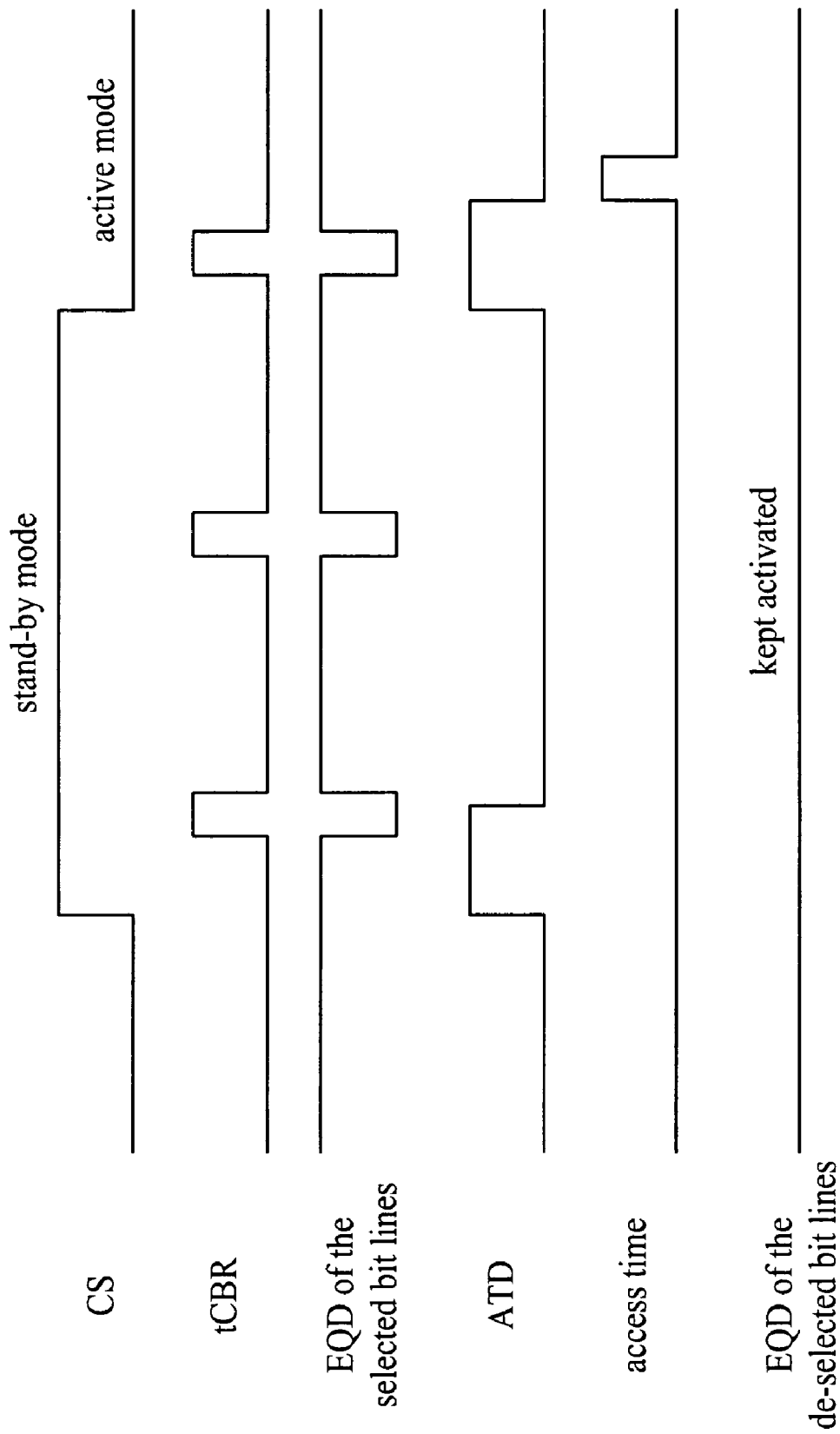
FIG. 4 shows a timing diagram of the control signals of a typical PSRAM device.
Figure 5:
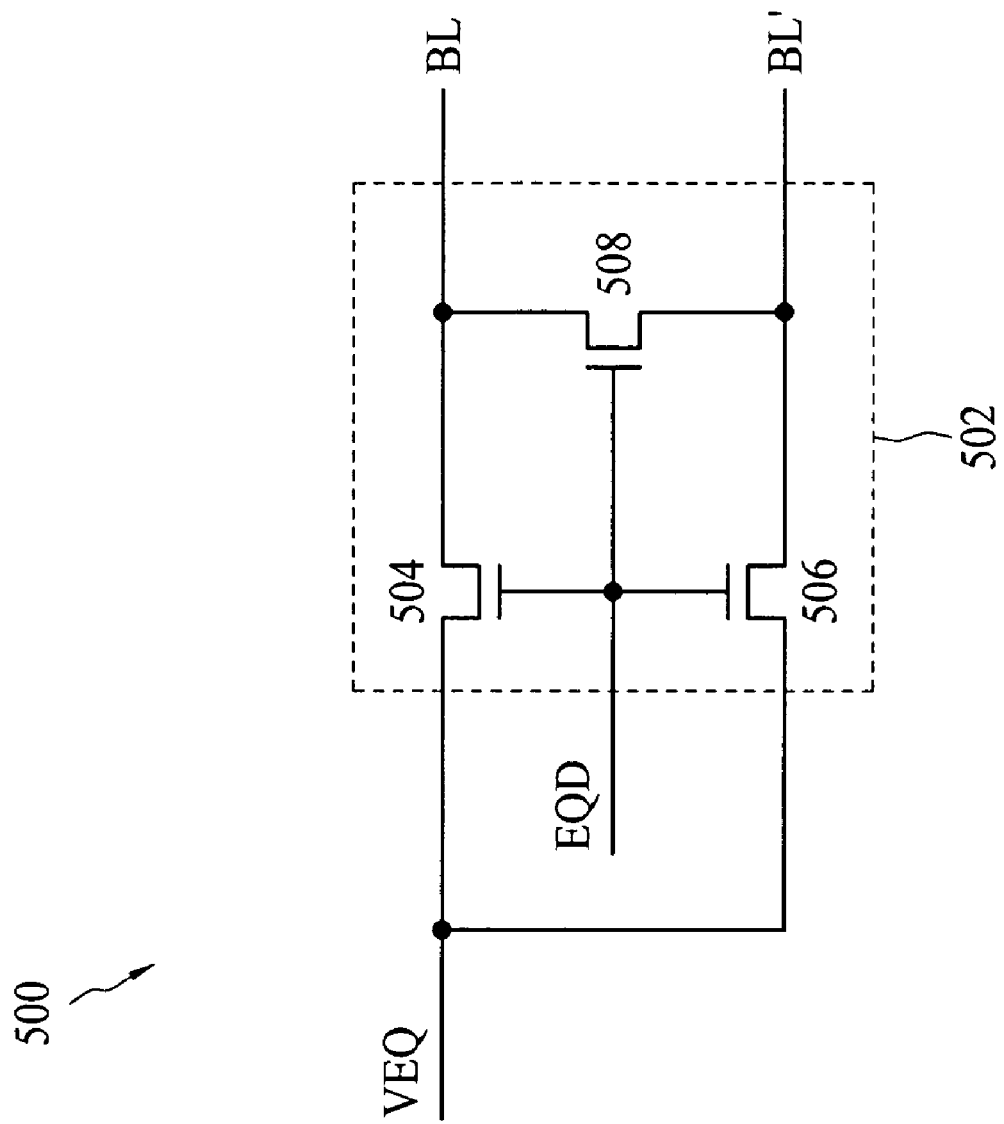
FIG. 5 shows a circuit for eliminating bit line leakage current in random access memory devices according to an embodiment of the present invention.

FIG. 5 shows a circuit 500 for eliminating bit line leakage current in random access memory devices according to an embodiment of the present invention. As shown in FIG. 5, the circuit 500 comprises a pre-charge equalization circuit 502 connected to a bit line BL and another bit line BL'. The pre-charge equalization circuit 502 comprises a first transistor 504, a second transistor 506 and a third transistor 508. The first transistor 504 connects a pre-charge voltage VEQ to the bit line BL. The second transistor 506 connects the pre-charge voltage VEQ to the bit line BL'. The third transistor 508 connects the bit line BL to the bit line BL'. A pre-charge signal EQD is used to control the first transistor 504, the second transistor 506 and the third transistor 508.

Figure 6:
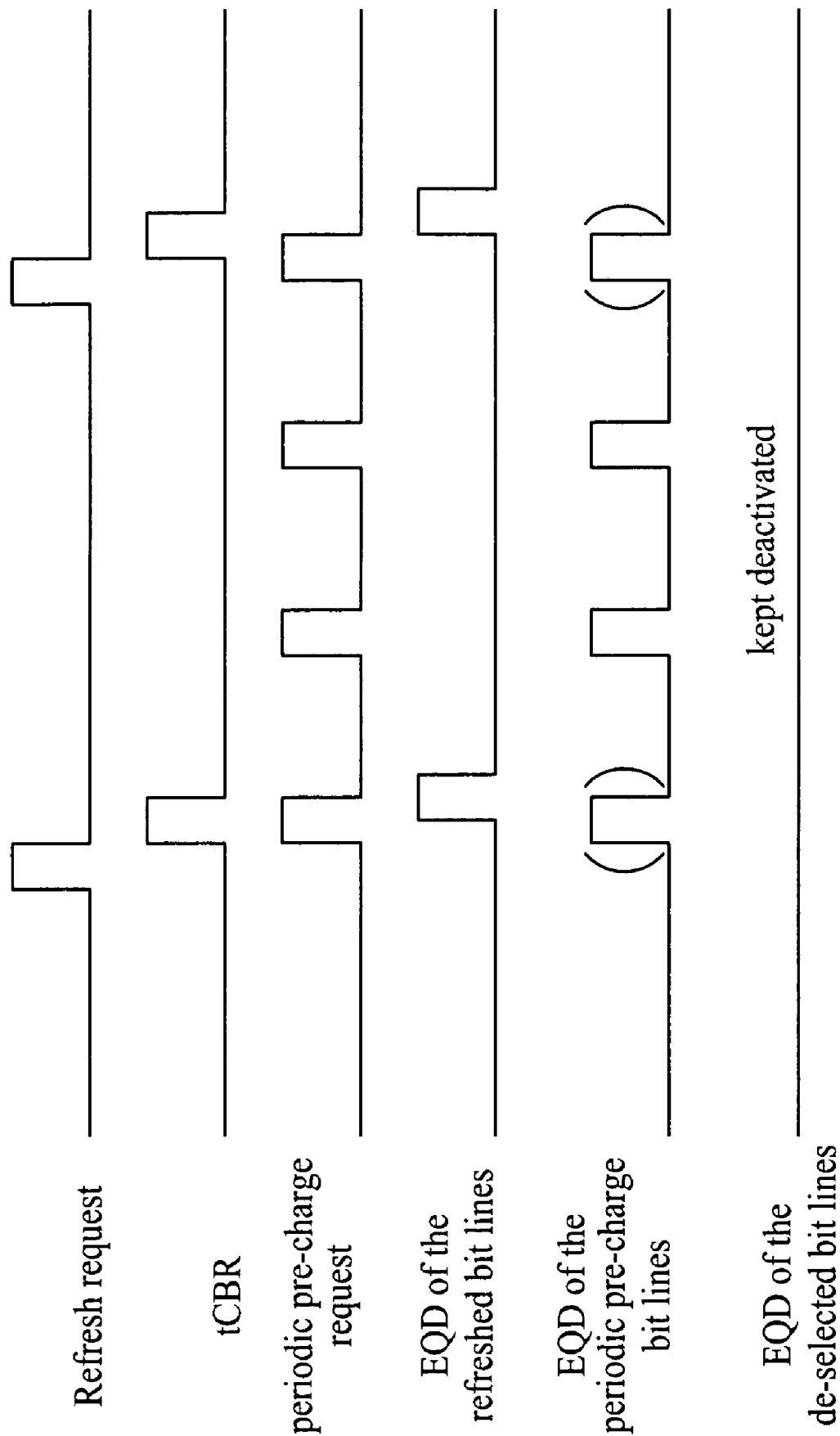
FIG. 6 shows a timing diagram of the control signals when applying a circuit for eliminating bit line leakage current in random access memory devices to a DRAM memory device according to an embodiment of the present invention.

FIG. 6 shows a timing diagram of the control signals when applying the circuit 500 shown in FIG. 5 to a DRAM memory device according to an embodiment of the present invention, wherein the DRAM memory device is operated in a self-refresh mode. As shown in FIG. 6, a refresh request is activated periodically, wherein the period is controlled by a timing counter. When a refresh is due, a refresh request is activated, and the refresh operation is performed within the refresh timing window tCBR. After the refresh operation, a pre-charge signal EQD is activated corresponding to the section of the refreshed memory cells. In addition, the pre-charge request of the circuit 500 is also activated periodically. It can be seen from FIG. 6 that unlike the conventional DRAM memory device, the pre-charge signal EQD is kept deactivated except when responding to the refresh request or a pre-charge request. That is, the pre-charge signal is activated periodically or after the corresponding memory cell is refreshed. Preferably, the periodic pre-charge operation is performed in a section-wise manner. That is, the bit lines in a section are pre-charged simultaneously, and then the bit lines in another section are pre-charged simultaneously, and so on. The period of the periodically activated pre-charge signal is shorter than the period of the refresh operations of the DRAM memory device. Accordingly, if the memory cells in one section are not refreshed, or the bit lines are not pre-charged, the bit lines in this section are floating. In this way, the leakage paths of the bit line leakage currents can be eliminated; the leakage current between a bit line and the corresponding word line through the inter dielectric, the leakage current between a bit line and the corresponding word line through the gate oxide of a transistor, and the leakage current between the a line BL and the corresponding P well of a transistor through the contact of the bit line BL, can all be eliminated.

In some embodiments of the present invention, if an activation of a pre-charge signal corresponding to a bit line (due to the periodic activation) coincides with another activation of another pre-charge signal to the same bit line (due to a refresh operation of the bit line), then one of the two activations of the pre-charge signal is omitted. As shown in FIG. 6, the periodic pre-charge operations in brackets are omitted since they are coincident with the pre-charge operations following the refresh operations.

Figure 7:
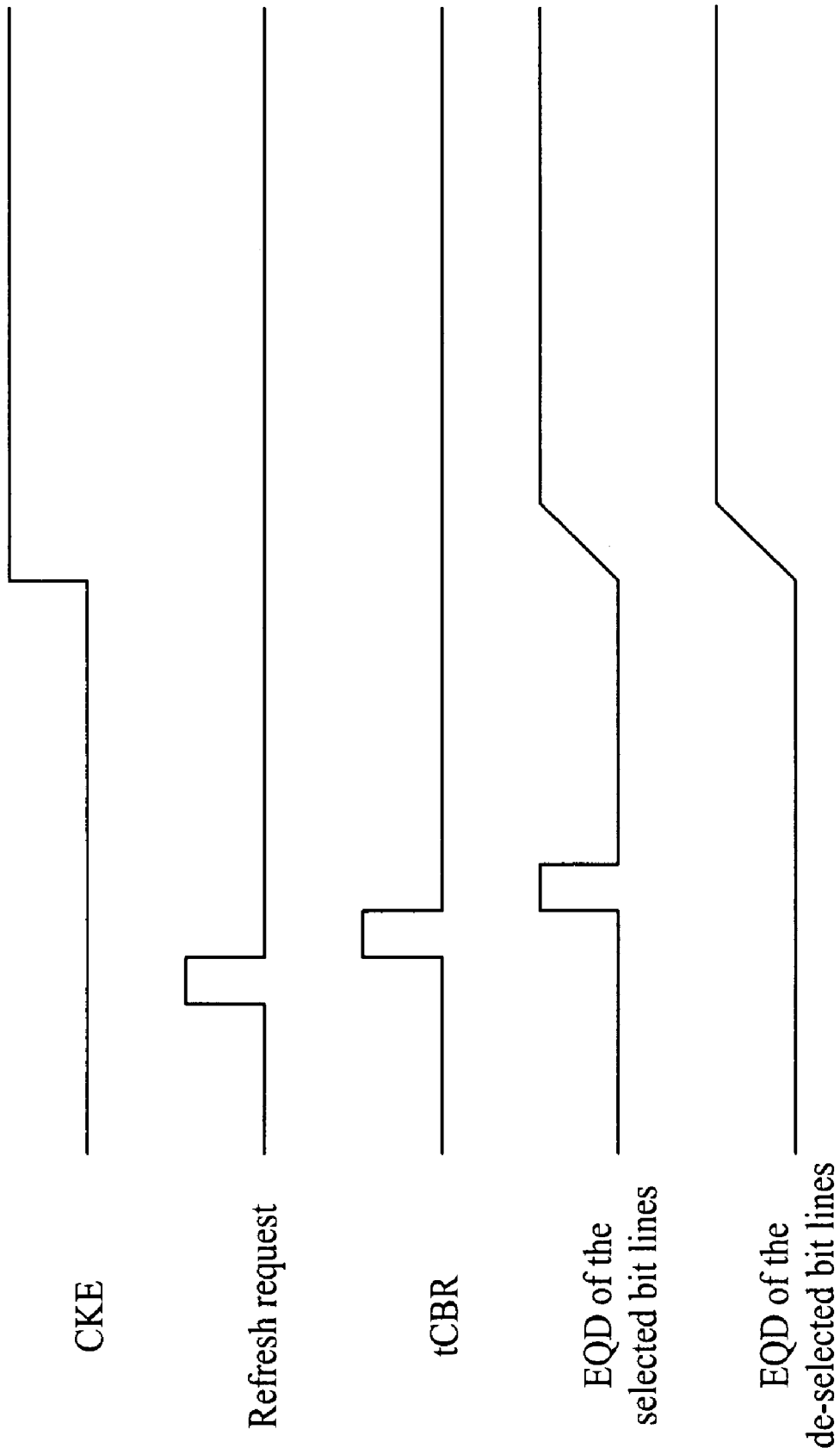
FIG. 7 shows a timing diagram of the control signals when applying a circuit for eliminating bit line leakage current in random access memory devices to a DRAM memory device according to another embodiment of the present invention.

In some embodiments of the present invention, if the DRAM memory device is leaving the self-refresh mode, all of the pre-charge signals to all of the circuits 500 are gradually activated. As shown in FIG. 7, the toggling of the signal CKE indicates the DRAM memory device is leaving the self-refresh mode. Accordingly, all of the pre-charge signals to all of the circuits 500 are gradually activated. In this way, the peak current caused by the mode change of the DRAM memory device can be reduced. Further, if the DRAM memory device is not operated in the self-refresh mode, the DRAM memory device is operated normally.

Figure 8:
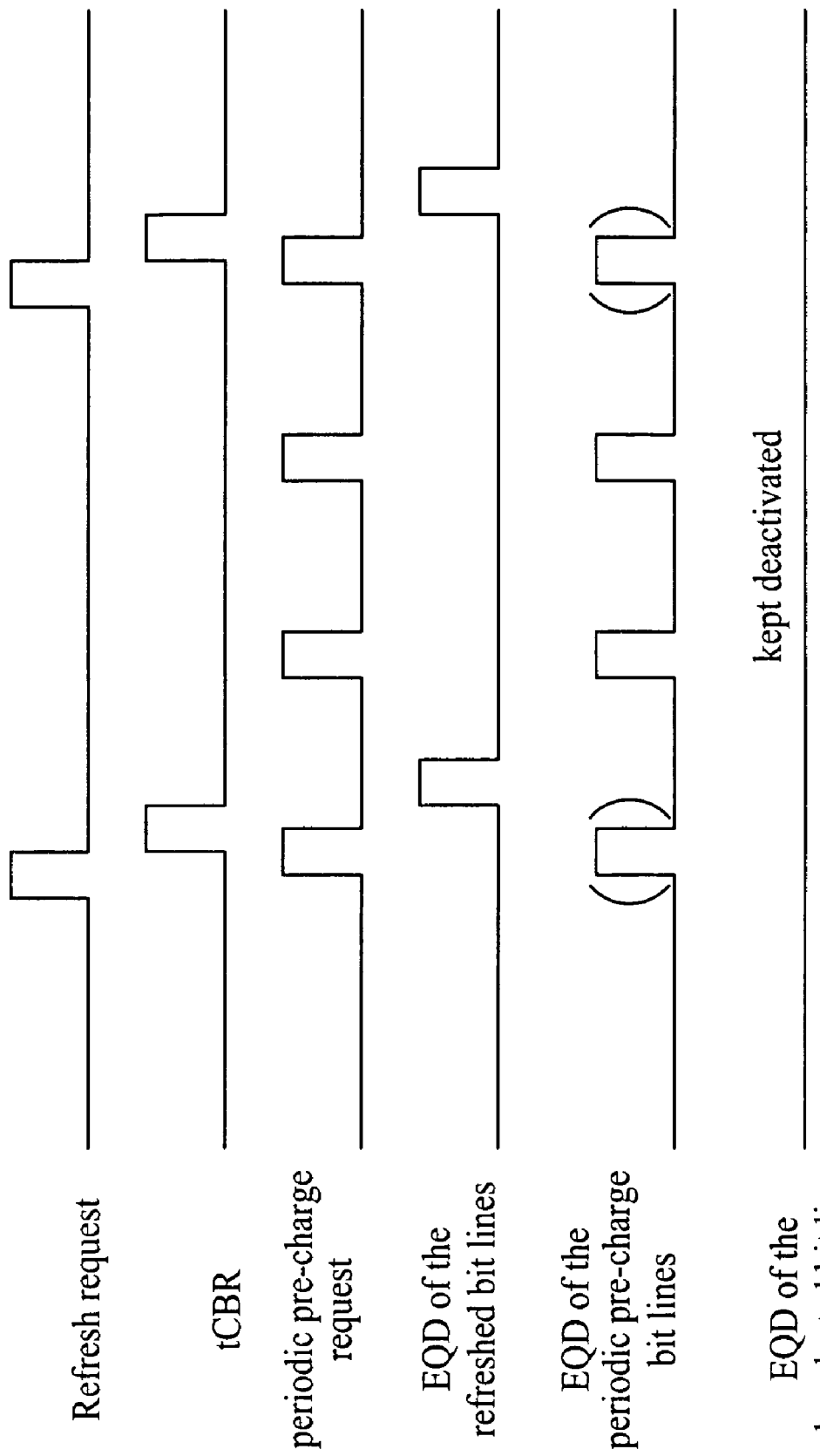
FIG. 8 shows a timing diagram of the control signals when applying a circuit for eliminating bit line leakage current in random access memory devices to a PSRAM memory device according to an embodiment of the present invention.

FIG. 8 shows a timing diagram of the control signals when applying the circuit 500 shown in FIG. 5 to a PSRAM memory device according to an embodiment of the present invention, wherein the PSRAM memory device is operated in a stand-by mode. Similar to the operation shown in FIG. 6, a refresh request is activated periodically. When a refresh is due, a refresh request is activated, and the refresh operation is performed within the refresh timing window tCBR. Afterward, a pre-charge signal EQD is activated corresponding to the section of the refreshed memory cells. In addition, the pre-charge request of the circuit 500 is also activated periodically. Accordingly, if the memory cells in one section are not refreshed, or the bit lines are not pre-charged, the bit lines in this section are floating. Preferably, the periodic pre-charge operation is performed in a section-wise manner, and the period of the periodically activated pre-charge signal is shorter than the period of the refresh operations of the DRAM memory device. Therefore, similar to the operation shown in FIG. 6, the leakage paths of the bit line leakage currents can be eliminated.

In some embodiments of the present invention, if an activation of a pre-charge signal corresponding to a bit line (due to the periodic activation) coincides with another activation of another pre-charge signal to the same bit to line (due to a refresh operation of the bit line), then one of the two activations of the pre-charge signal is omitted. As shown in FIG. 8, the periodic pre-charge operations in brackets are omitted since they are coincident with the pre-charge operations following the refresh operations.

Figure 9:
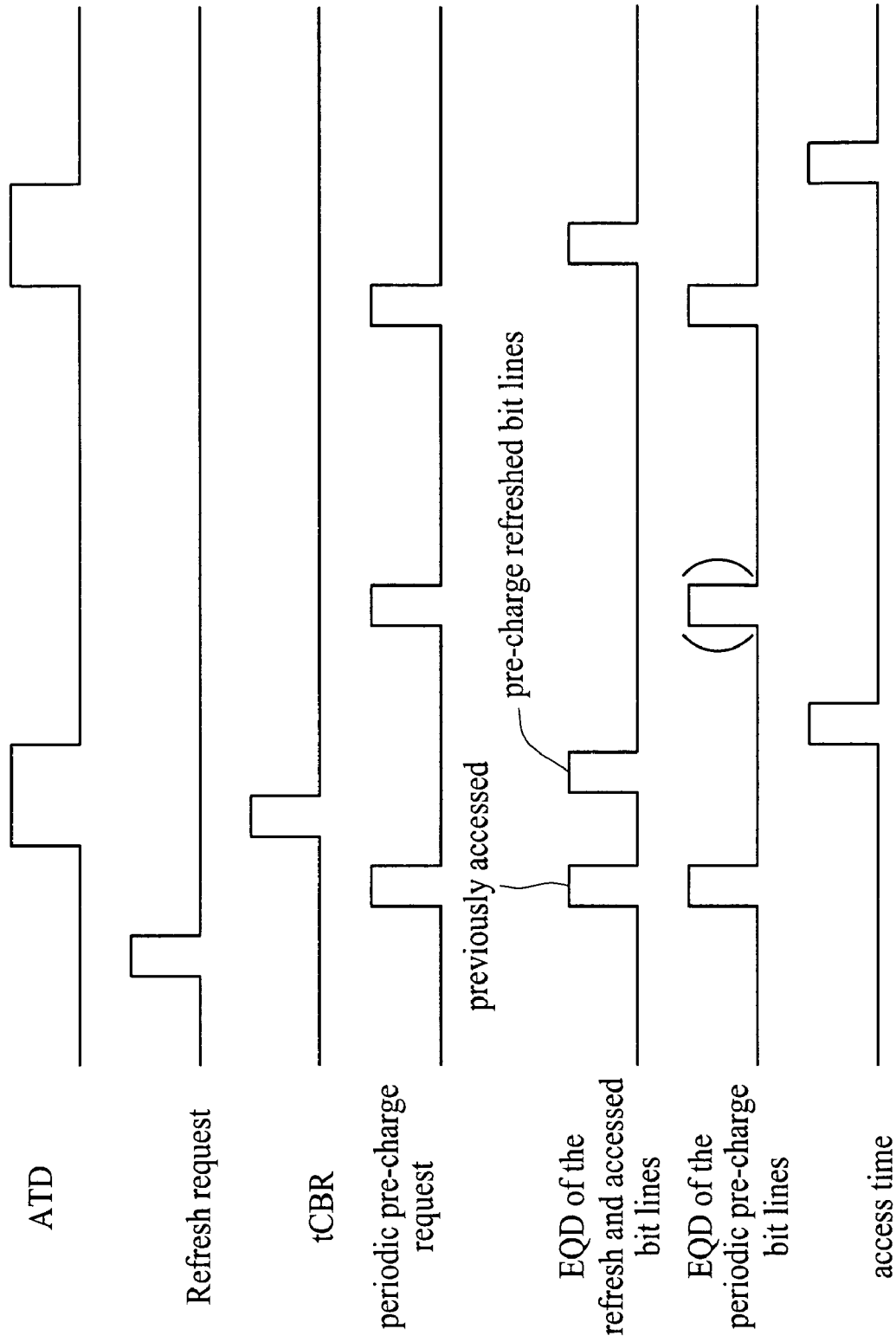
FIG. 9 shows a timing diagram of the control signals when applying a circuit for eliminating bit line leakage current in random access memory devices to a PSRAM memory device according to another embodiment of the present invention.

FIG. 9 shows a timing diagram of the control signals when applying the circuit 500 shown in FIG. 5 to a PSRAM memory device according to an embodiment of the present invention, wherein the PSRAM memory device is operated in an active mode. While operating in an active mode, a signal ATD is activated for each address toggle or mode change. In the interval of the signal ATD, three operations are carried out: a bit line pre-charge operation to the previously accessed address, a refresh operation if requested, and a bit line pre-charge operation to the current accessed address. Similar to the operation shown in FIG. 8, a refresh request is activated periodically. When a refresh is due, a refresh request is activated, and the refresh operation is performed within the refresh timing window tCBR. After the refresh operation, a pre-charge signal EQD is activated corresponding to the section of the refreshed memory cells. In addition, the pre-charge request of the circuit 500 is also activated periodically. Accordingly, if the memory cells in one section are not refreshed or accessed, or the bit lines are not pre-charged, the bit lines in this section are floating. Preferably, the periodic pre-charge operation is performed in a section-wise manner, and the period of the periodically activated pre-charge signal is shorter than the period of the refresh operations of the DRAM memory device. Therefore, similar to the operation shown in FIG. 8, the leakage paths of the bit line leakage currents can be eliminated.

In some embodiments of the present invention, if an activation of a pre-charge signal corresponding to a bit line (due to the periodic activation) coincides with another activation of another pre-charge signal of the same bit line (due to a refresh operation of the bit line), then one of the two activations of the pre-charge signal is omitted. As shown in FIG. 9, the periodic pre-charge operations in the brackets are omitted, since they are coincident with the pre-charge operations following the refresh operations.

Figure 10:
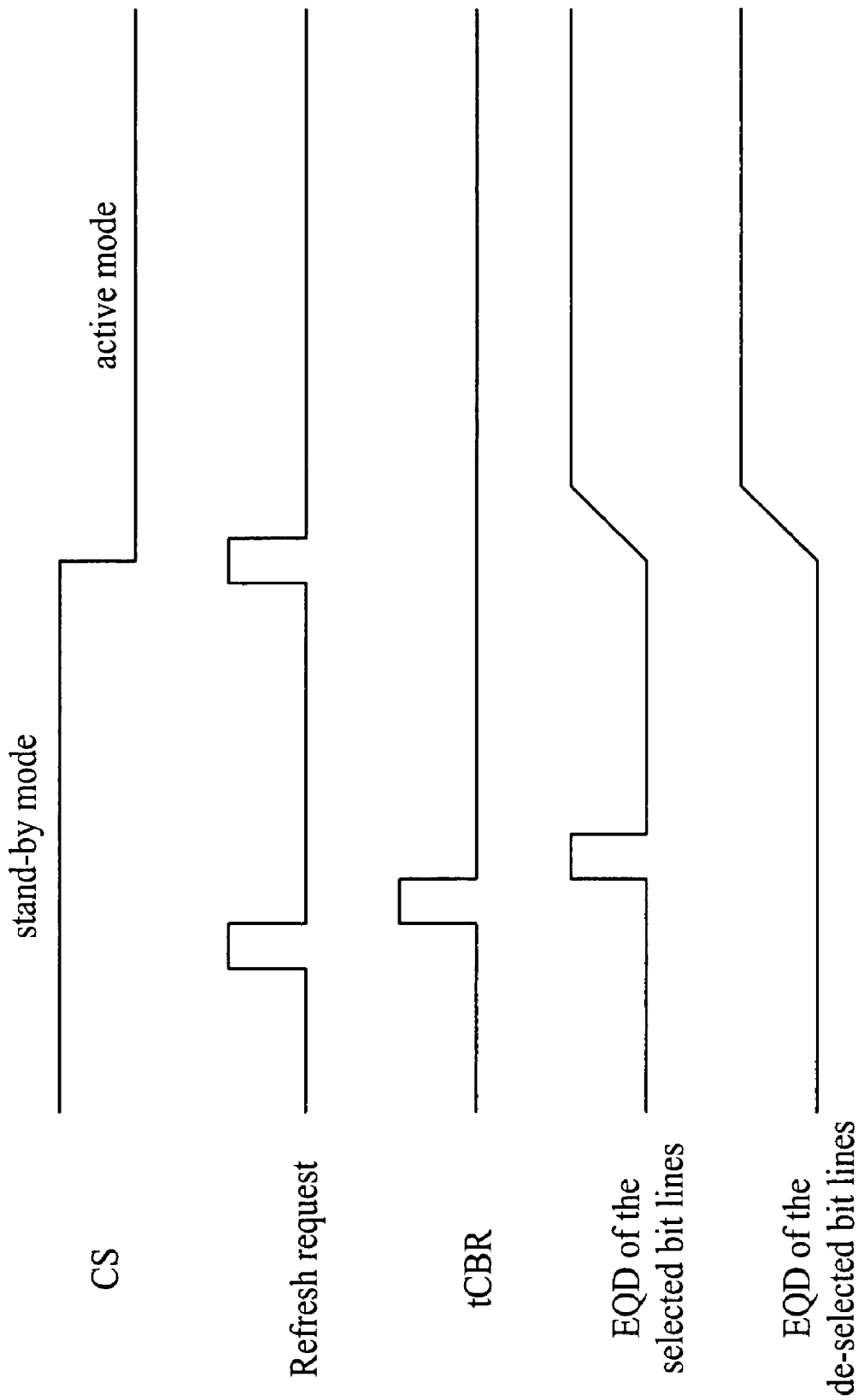
FIG. 10 shows a timing diagram of the control signals when applying a circuit for eliminating bit line leakage current in random access memory devices to a PSRAM memory device according to another embodiment of the present invention.

In some embodiments of the present invention, while the PSRAM memory device is operating in an active mode, the periodic pre-charge operation is not carried out, and the pre-charge signal is kept activated except while the memory cell is being accessed. In such embodiments, if the PSRAM memory device is leaving the stand-by mode, all of the pre-charge signals to all of the circuits 500 are gradually activated, as shown in FIG. 10. As shown in FIG. 10, the toggling of the signal CS indicates the DRAM memory device is leaving the self-refresh mode. Accordingly, all of the pre-charge signals to all of the circuits 500 are gradually activated. In this way, the peak current caused by the mode change of the PSRAM memory device can be reduced.

In conclusion, the embodiments of the present invention utilize a periodic pre-charge technique such that the bit lines are provided with a pre-charge voltage only when the corresponding memory cells are periodically pre-charged, refreshed or accessed. Therefore, the bit lines are floating when the corresponding memory cells are not pre-charged, refreshed or accessed. Accordingly, the bit line leakage current in random access memory devices can be eliminated.

The above-described embodiments of the present invention are intended to be illustrative only. Those skilled in the art may devise numerous alternative embodiments without departing from the scope of the following claims.

What is claimed is:

1. A circuit for eliminating bit line leakage current in random access memory devices, comprising:
   a pre-charge equalization circuit providing a pre-charge voltage to a pair of complementary bit lines of a memory cell in accordance with a pre-charge signal;
   wherein if an activation of the pre-charge signal due to the periodic activation coincides with another activation of the pre-charge signal due to a refresh operation of the memory cell, then one of the two activations of the pre-charge signal is omitted; and
   wherein when the memory cell is in a self-refresh mode or a stand-by mode, the pre-charge signal is activated both periodically and after the memory cell is refreshed.

2. The circuit of claim 1, wherein the period of the periodically activated pre-charge signal is shorter than the period of the refresh operations of the memory cell.

3. The circuit of claim 1, wherein the memory cell is a dynamic random access memory (DRAM) cell, and when the memory cell is not in the self-refresh mode, the pre-charge signal is kept activated except while the memory cell is being accessed.

4. The circuit of claim 3, wherein if the memory cell is leaving the self-refresh mode, the pre-charge signal is gradually activated.

5. The circuit of claim 1, wherein the memory cell is a pseudo static random access memory (PSRAM) cell, and while the memory cell is in an active mode, the pre-charge signal is activated both periodically and after the memory cell is accessed or refreshed.

6. The circuit of claim 1, wherein the memory cell is a PSRAM cell, and while the memory cell is in an active mode, the pre-charge signal is kept activated, except while the memory cell is being accessed.

7. The circuit of claim 6, wherein if the memory cell is leaving the stand-by mode, the pre-charge signal is gradually activated.

8. A method for eliminating bit line leakage current of a memory cell in random access memory devices, comprising the steps of:
   periodically activating a pre-charge equalization circuit, which provides a pre-charge voltage to a pair of complementary bit lines of a memory cell, if the memory cell is in a self-refresh mode or a standby mode; and
   temporarily activating the pre-charge equalization circuit after the memory cell is refreshed if the memory cell is in the self-refresh mode or the standby mode;
   wherein if the periodically activating step coincides with the temporarily activating step, then the periodically activating step is omitted.

9. The method of claim 8, wherein the period of the periodically activating step is shorter than the period of the refresh operations of the memory cell.

10. The method of claim 8, wherein the memory cell is a DRAM cell.

11. The method of claim 10, further comprising the step of:
    continuously activating the pre-charge equalization circuit except while the memory cell is being accessed, if the memory cell is not in the self-refresh mode.

12. The method of claim 10, further comprising a step of:
    gradually activating the pre-charge equalization circuit if the memory cell is leaving the self-refresh mode.

13. The method of claim 8, wherein the memory cell is a PSRAM cell.

14. The method of claim 13, further comprising a step of:
    continuously activating the pre-charge equalization circuit except while the memory cell is being accessed, if the memory cell is not in the stand-by mode.

15. The method of claim 13, further comprising a step of:
    periodically activating the pre-charge equalization circuit if the memory cell is in an active mode; and
    temporarily activating the pre-charge equalization circuit after the memory cell is accessed or refreshed if the memory cell is in the active mode.

16. The method of claim 13, further comprising a step of:
    gradually activating the pre-charge equalization circuit if the memory cell is leaving the stand-by mode.

* * * * *